United States Patent
Ogumi

(10) Patent No.: US 11,133,234 B2
(45) Date of Patent: Sep. 28, 2021

(54) SEMICONDUCTOR DEVICE AND SEMICONDUCTOR DEVICE MANUFACTURING METHOD

(71) Applicant: LAPIS SEMICONDUCTOR CO., LTD., Kanagawa (JP)

(72) Inventor: Taiichi Ogumi, Miyazaki (JP)

(73) Assignee: LAPIS SEMICONDUCTOR CO., LTD., Yokohama (JP)

(*) Notice: Subject to any disclaimer, the term of this patent is extended or adjusted under 35 U.S.C. 154(b) by 0 days.

(21) Appl. No.: 16/173,056

(22) Filed: Oct. 29, 2018

(65) Prior Publication Data
US 2019/0131198 A1    May 2, 2019

(30) Foreign Application Priority Data
Oct. 30, 2017  (JP) .............................. JP2017-209319

(51) Int. Cl.
*H01L 23/02* (2006.01)
*H01L 23/31* (2006.01)
(Continued)

(52) U.S. Cl.
CPC ...... *H01L 23/3114* (2013.01); *H01L 21/0217* (2013.01); *H01L 21/02164* (2013.01); *H01L 21/02274* (2013.01); *H01L 21/31111* (2013.01); *H01L 21/31144* (2013.01); *H01L 21/78* (2013.01); *H01L 22/32* (2013.01);
(Continued)

(58) Field of Classification Search
CPC ... H01L 21/02164; H01L 22/34; H01L 22/32; H01L 23/3114
See application file for complete search history.

(56) References Cited

U.S. PATENT DOCUMENTS

| 5,229,647 | A | * | 7/1993 | Gnadinger | ............... | G11C 5/00 |
| | | | | | | 257/686 |
| 2008/0299789 | A1 | * | 12/2008 | Usui | ................. | H01L 23/49827 |
| | | | | | | 439/65 |

(Continued)

FOREIGN PATENT DOCUMENTS

| JP | 2015138874 A | 7/2015 |
| JP | 2016-219749 A | 12/2016 |

OTHER PUBLICATIONS

Japanese Office Action dated Aug. 24, 2021 for Japanese Application No. 2017-209319, 5 pgs.

*Primary Examiner* — Samuel A Gebremariam
(74) *Attorney, Agent, or Firm* — Volentine, Whitt & Francos, PLLC

(57) ABSTRACT

A semiconductor device includes: a wire including a first conductive member disposed at a semiconductor substrate and a second conductive member disposed at a surface of the first conductive member, the second conductive member having an ionization tendency less than the first conductive member, wherein the first conductive member includes a first surface disposed close to the second conductive member and having a width smaller than a width of a second surface of the first conductive member which is disposed close to the semiconductor substrate, and wherein the second conductive member has a width larger than the width of the first surface of the first conductive member and smaller than the width of the second surface of the first conductive member.

6 Claims, 15 Drawing Sheets

(51) Int. Cl.
*H01L 21/02* (2006.01)
*H01L 21/66* (2006.01)
*H01L 21/311* (2006.01)
*H01L 21/78* (2006.01)
*H01L 23/00* (2006.01)
*H01L 21/683* (2006.01)

(52) U.S. Cl.
CPC .............. *H01L 22/34* (2013.01); *H01L 24/03* (2013.01); *H01L 24/05* (2013.01); *H01L 24/11* (2013.01); *H01L 21/6836* (2013.01); *H01L 22/12* (2013.01); *H01L 24/13* (2013.01); *H01L 2221/6834* (2013.01); *H01L 2221/68327* (2013.01); *H01L 2224/02166* (2013.01); *H01L 2224/0347* (2013.01); *H01L 2224/0361* (2013.01); *H01L 2224/0401* (2013.01); *H01L 2224/05147* (2013.01); *H01L 2224/05166* (2013.01); *H01L 2224/05548* (2013.01); *H01L 2224/05552* (2013.01); *H01L 2224/05644* (2013.01); *H01L 2224/11* (2013.01); *H01L 2224/13014* (2013.01); *H01L 2224/13111* (2013.01); *H01L 2924/1304* (2013.01)

(56) References Cited

U.S. PATENT DOCUMENTS

2011/0086486 A1* 4/2011 Lee .................. H01L 25/50
　　　　　　　　　　　　　　　　　　　　　438/381
2014/0117533 A1* 5/2014 Lei .................. H01L 24/03
　　　　　　　　　　　　　　　　　　　　　257/737
2018/0082963 A1* 3/2018 Lin .................. H01L 24/08

* cited by examiner

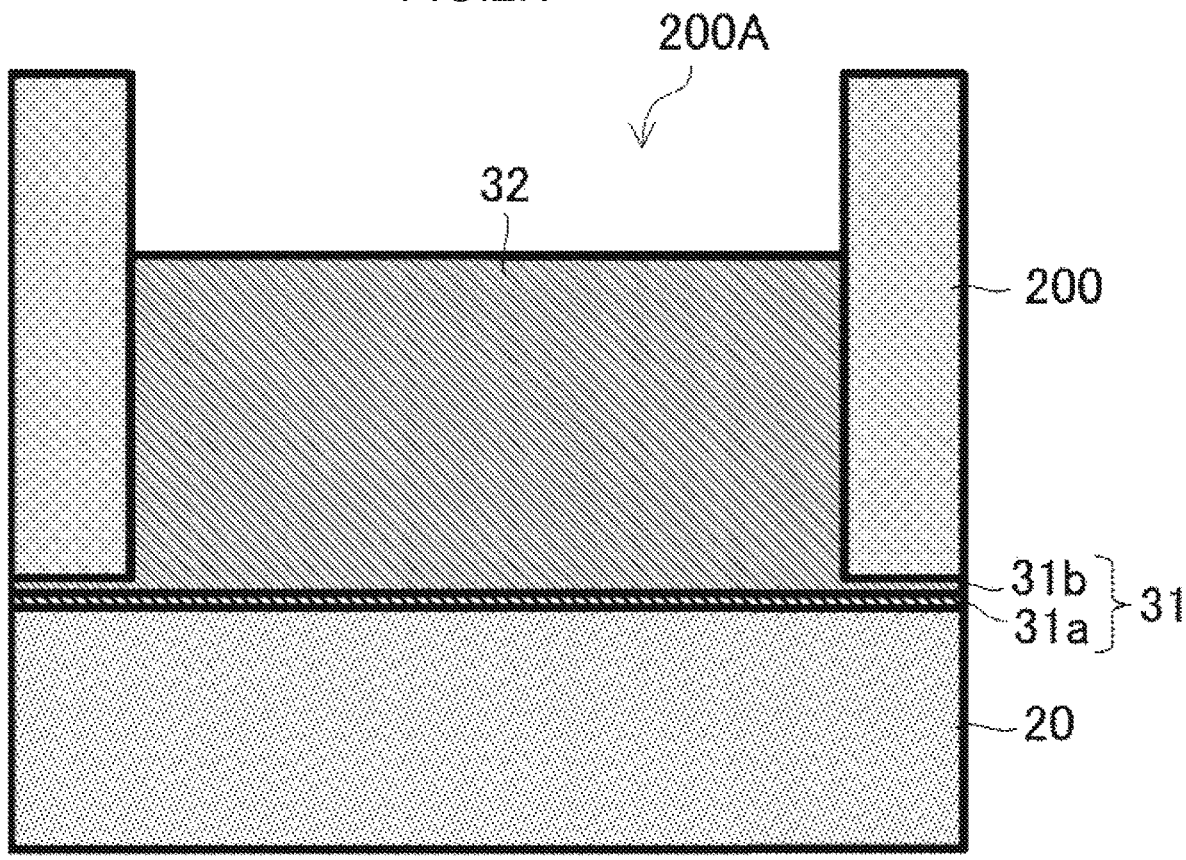
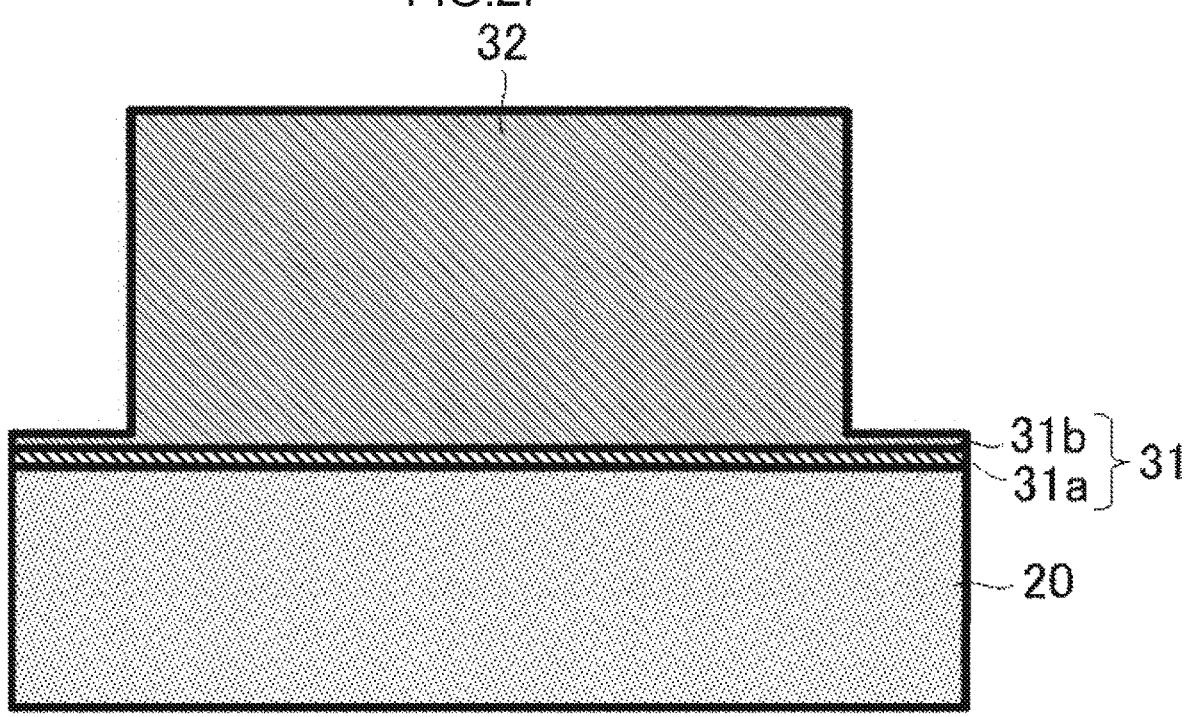

SEMICONDUCTOR DEVICE AND SEMICONDUCTOR DEVICE MANUFACTURING METHOD

CROSS-REFERENCE TO RELATED APPLICATION

This application claims priority under 35 USC 119 from Japanese Patent Application No. 2017-209319, filed on Oct. 30, 2017, the disclosure of which is incorporated by reference herein.

BACKGROUND

Technical Field

The present disclosure relates to a semiconductor device and a semiconductor device manufacturing method.

Related Art

Wafer level chip size package (WL-CSP) is packaging technology for semiconductor devices that implements redistribution, forming of electrode, resin sealing, and dicing, in wafer processes.

For example, Japanese Patent Application Laid-Open (JP-A) No. 2015-138874 discloses a configuration of a semiconductor device provided with a redistribution, similarly to WL-CSP. In the semiconductor device disclosed in JP-A No. 2015-138874, the redistribution is disposed on an insulating film formed on a semiconductor substrate.

A redistribution used in WL-CSP typically includes a Cu film. For the purpose of reducing resistance in a wire of a redistribution, the present discloser uses a laminated film including an Au film and a Cu film for redistribution. Redistribution with a laminated film including a Cu film and an Au film not only reduces resistance, but also prevents oxidation of the Cu film in manufacturing processes. Furthermore, making the outermost surface of the redistribution with an Au film enables wire bonding with respect to the redistribution. Accordingly, depending on the intended use, the above disclosure may create two types of packages, WL-CSP and ordinary package, from an identical chip.

Each of a Cu film and an Au film included in a redistribution is both formed by electroplating in which a current is carried through a seed layer containing Cu. In the present discloser, in a case in which a redistribution is made with a laminated film including a Cu film and an Au film, the Au film and the Cu film generate a local cell effect in an etching process to remove a seed layer, causing excessive etching of the Cu film included in the redistribution.

In a case where a wire in the redistribution has a small width, excessive etching of the Cu film due to the local cell effect may vanish the Cu film completely, which may cause peeling of the Au film. In such a case, the peeled Au film may remain in a manufacturing apparatus and may adhere on other products. Further, even in a case in which the Cu film does not completely vanish, excessive etching of the Cu film reduces a contact area between the Cu film and an insulating film (serving as a base of the redistribution), which reduces adhesion of the redistribution with respect to the insulating film. Accordingly, the redistribution may be peeled from the insulating film.

Furthermore, since the Au film covers the excessively etched Cu film like an eave, observing and checking the state of the Cu film from its upper surface may become difficult. Namely, in the conventional technology, checking the result of the redistribution performed in manufacturing processes may become difficult.

SUMMARY

The present disclosure provides a semiconductor device that may prevent excessive etching of a conductive member included in a redistribution due to a local cell effect.

A first aspect of the present disclosure is a semiconductor device including: a wire including a first conductive member disposed at a semiconductor substrate and a second conductive member disposed at a surface of the first conductive member, the second conductive member having an ionization tendency less than the first conductive member, wherein the first conductive member includes a first surface disposed close to the second conductive member and having a width smaller than a width of a second surface of the first conductive member which is disposed close to the semiconductor substrate, and wherein the second conductive member has a width larger than the width of the first surface of the first conductive member and smaller than the width of the second surface of the first conductive member.

A second aspect of the present disclosure is a semiconductor device manufacturing method including: forming a first insulating film at a surface of a semiconductor substrate; forming a seed layer at a surface of the first insulating film; forming a first conductive member at the surface of the first insulating film by electroplating by applying a current through the seed layer; forming a second conductive member at the surface of the first conductive member by electroplating by applying a current through the seed layer, the second conductive member being disposed at inner side with respect to the first conductive member; and removing the seed layer by etching, wherein the second conductive member has a width smaller than a width of the first conductive member and has an ionization tendency less than the first conductive member.

According to the above aspects, the present disclosure provides a semiconductor device that may prevent a conductive member included in a redistribution from being excessively etched due to a local cell effect.

BRIEF DESCRIPTION OF THE DRAWINGS

Exemplary embodiments will be described in detail based on the following figures, wherein.

DETAILED DESCRIPTION

Figure 1A:
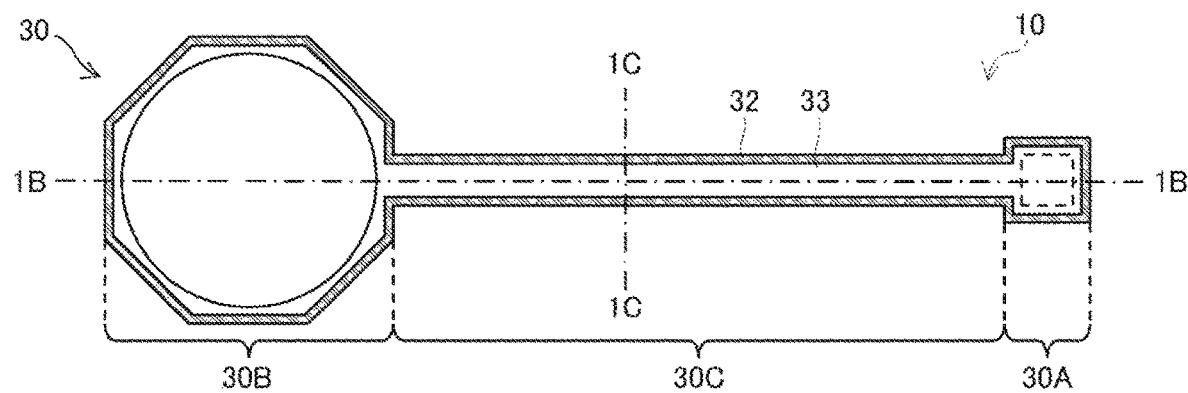
FIG. 1A is a plan view showing a configuration of an area for forming a redistribution included in a semiconductor device, according to an exemplary embodiment of the disclosure.

Hereinafter, exemplary embodiments of the disclosure will be described with reference to the drawings. In the drawings, substantially the same or equivalent components or portions are denoted by the same reference numerals.

Figure 1B:
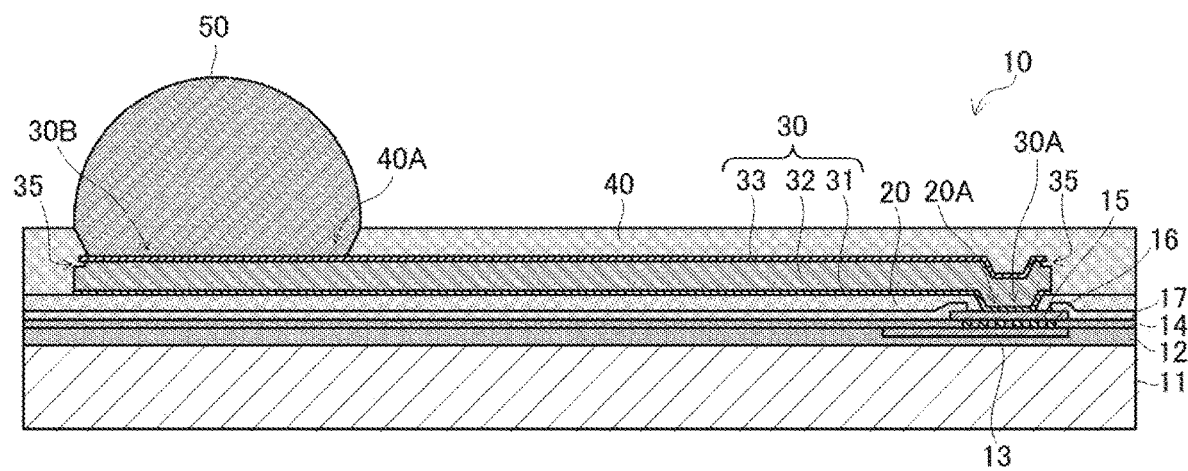
FIG. 1B is a cross-sectional view taken along line 1B-1B of FIG. 1A.
Figure 1C:
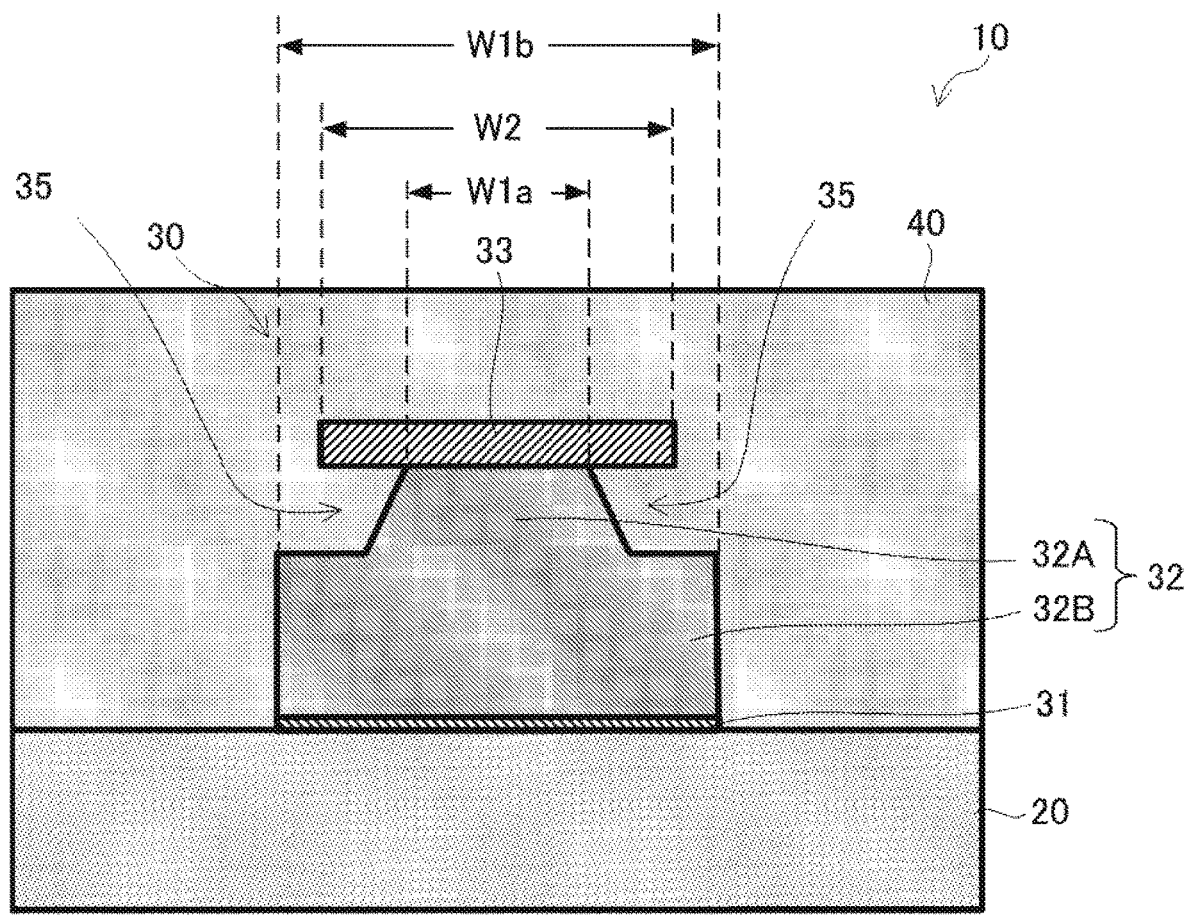
FIG. 1C is a cross-sectional view taken along line 1C-1C of FIG. 1A.

FIG. 1A is a plan view showing a configuration of an area for forming a redistribution 30 included in a semiconductor device 10 according to an exemplary embodiment of the disclosure. FIG. 1B is a cross-sectional view taken along line 1B-1B of FIG. 1A. FIG. 1C is a cross-sectional view taken along line 1C-1C of FIG. 1A. A lower insulating film 20, an upper insulating film 40, and an external connection terminal 50 shown in FIG. 1B are not shown in FIG. 1A.

The semiconductor device 10 includes a package which is similar to WL-CSP in shape. In other words, in the semiconductor device 10, a planar size of the package is substantially equal to a planar size of a semiconductor substrate 11. The semiconductor device 10 includes the lower insulating film 20 disposed on the semiconductor substrate 11, the redistribution 30 disposed on a surface of the lower insulating film 20, and the upper insulating film 40 that covers the lower insulating film 20 and the redistribution 30.

A surface of the semiconductor substrate 11 is formed with a semiconductor element (not shown) such as a transistor, a resistor, and a capacitor. The surface of the semiconductor substrate 11 is covered with an interlayer insulating film 12 including an insulator such as $SiO_2$. The interlayer insulating film 12 internally includes a wire 13 connected to the semiconductor element included in the semiconductor substrate 11. A surface of the interlayer insulating film 12 is covered with an interlayer insulating film 14 including an insulator such as $SiO_2$. A surface of the interlayer insulating film 14 is provided with a chip electrode 15 and a passivation film (protective film) 17. The chip electrode 15 is connected to the wire 13 through a via 16, and the passivation film 17 includes an opening that partly exposes a surface of the chip electrode 15.

A surface of the passivation film 17 is covered with the lower insulating film 20 having a thickness of about from 5 μm to 10 μm. The lower insulating film 20 includes a photosensitive organic insulating member such as polyimide and polybenzoxazole (PBO). The lower insulating film 20 is provided with an opening 20A that partially exposes the surface of the chip electrode 15.

On a surface of the lower insulating film 20, the redistribution 30 is disposed. The redistribution 30 includes an under barrier metal (UBM) film 31, a first conductive member 32, and a second conductive member 33. The UBM film 31 includes an adhesion layer 31a including a Ti film to enhance adhesion between the lower insulating film 20 and the redistribution 30 (e.g. see FIG. 2F).

The first conductive member 32 is disposed on a surface of the UBM film 31, and the second conductive member 33 is disposed on a surface of the first conductive member 32. A preferable example of the first conductive member 32 includes a Cu film. A preferable example of the second conductive member 33 includes an Au film. The redistribution 30 includes the second conductive member 33 including an Au film, which reduces resistance in the redistribution 30. In the opening 20A of the lower insulating film 20, the redistribution 30 is connected to the chip electrode 15.

The lower insulating film 20 and the redistribution 30 are covered with the upper insulating film 40 having a thickness of about from 5 μm to 10 μm. The upper insulating film 40 includes a photosensitive organic insulating member such as polyimide and PBO. The upper insulating film 40 is provided with an opening 40A that partially exposes the redistribution 30 at a position where the external connection terminal 50 is formed. The external connection terminal 50 contains SnAg, for example, and is connected to a surface of the redistribution 30 (second conductive member 33) that is exposed in the opening 40A of the upper insulating film 40.

In such a manner, the redistribution 30 has one end connected to the chip electrode 15 through the opening 20A included in the lower insulating film 20, and therefore is connected the semiconductor element included in the semiconductor substrate 11. Further, the redistribution 30 has the other end connected to the external connection terminal 50 through the opening 40A included in the upper insulating film 40. One end of the redistribution 30 connected to the semiconductor element is a connection portion 30A, the other end connected to the external connection terminal 50 is a pad portion (land portion) 30B, and a portion that links the connection portion 30A with the pad portion 30B is a wire portion 30C.

Hereinafter, the configuration of the redistribution 30 will be described in detail. As described above, the redistribution 30 includes the UBM film 31 including the adhesion layer 31a, the first conductive member 32 including the Cu film disposed on the UBM film 31, and the second conductive member 33 including the Au film disposed on the first conductive member 32.

As shown in FIG. 1C, the first conductive member 32 includes a base portion 32B disposed on a surface that contacts the lower insulating film 20 through the UBM film 31 (hereinafter referred to as "lower surface"), and a narrowing portion 32A disposed on a surface that contacts the second conductive member 33 (hereinafter referred to as "upper surface"). A side wall of the base portion 32B is substantially perpendicular to a principal plane of the semiconductor substrate 11, and an upper surface of the base portion 32B is substantially parallel to the principal plane of the semiconductor substrate 11. In other words, the base portion 32B has a rectangular cross-section. A width, in a bottom portion of the narrowing portion 32A connected to the upper surface of the base portion 32B, is smaller than a width, in the upper surface of the base portion 32B. Namely, the narrowing portion 32A has a forward tapered cross-section. In other words, a side wall of the narrowing portion 32A is inclined relative to the principal plane of the semiconductor substrate 11, and the width of the narrowing portion 32A is gradually reduced toward the upper surface. In this manner, in the first conductive member 32, a width W1a of the upper surface is smaller than a width W1b of the lower surface.

A width W2 of the second conductive member 33 is smaller than the width W1b of the lower surface of the first conductive member 32 and is larger than the width W1a of the upper surface of the first conductive member 32. In a width direction of the redistribution 30, the second conductive member 33 is disposed at the inner side with respect to the first conductive member 32, as shown in FIG. 1A. However, both ends in the width direction of the second conductive member 33 protrude from the narrowing portion 32A of the first conductive member 32, as shown in FIG. 1C. In other words, both ends in the width direction of the narrowing portion 32A are disposed at the inner side with respect to the second conductive member 33. The widths W1$a$, W1$b$, and W2 are lengths in a direction intersecting with a drawing direction (extension direction) of the redistribution 30.

Due to such configurations of the first conductive member 32 and the second conductive member 33, a recess 35 recessed inward in the width direction of the redistribution 30 is formed in the redistribution 30 in an area around a boundary between the first conductive member 32 and the second conductive member 33. The upper insulating film 40 that covers the redistribution 30 fills the recess 35 of the redistribution 30. The portions of the second conductive member 33 protruding from the narrowing portion 32A are in contact with the upper insulating film 40. The recess 35 is formed when the first conductive member 32 is etched due to a local cell effect of the first conductive member 32 and the second conductive member 33 in an etching process for removing a seed layer 31$b$ (see FIG. 2F) included in the UBM film 31. In the cross-section shown in FIG. 1B, the recess 35 is observed both at an end close to the connection portion 30A of the redistribution 30 and at an end close to the pad portion 30B.

Figure 2A:
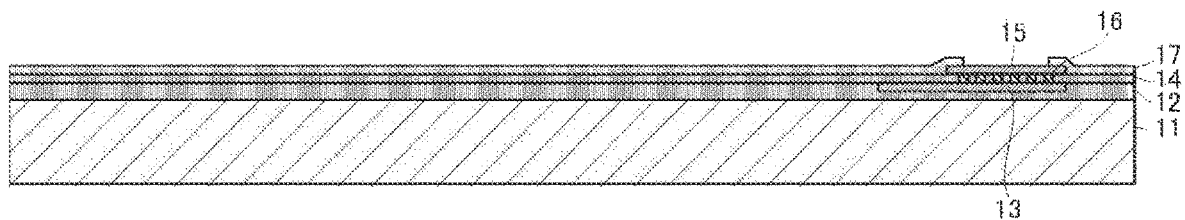
FIG. 2A to FIG. 2S are cross-sectional views each showing a manufacturing processes of a semiconductor device according to the exemplary embodiment of the disclosure.

Hereinafter, manufacturing processes of the semiconductor device 10 will be described with reference to FIG. 2A to FIG. 2S. FIG. 2A to FIG. 2E and FIG. 2P to FIG. 2S each show a cross-section corresponding to the cross-section taken along line 1B-1B of FIG. 1A, and FIG. 2F to FIG. 2O each show a cross-section corresponding to the cross-section taken along line 1C-1C of FIG. 1A.

First, the semiconductor substrate 11 that has undergone wafer processes is prepared (FIG. 2A). The wafer processes includes: forming a semiconductor element (not shown) such as a transistor on the semiconductor substrate 11; forming the interlayer insulating film 12 including an insulator such as $SiO_2$ on the surface of the semiconductor substrate 11; forming the wire 13 connected to the semiconductor element; forming the interlayer insulating film 14 including an insulator such as $SiO_2$ on the surface of the wire 13; forming the chip electrode 15 connected to the wire 13 through the via 16 on the surface of the interlayer insulating film 14; and forming the passivation film 17 partially exposing the chip electrode 15 on the surface of the interlayer insulating film 14.

Figure 2B:
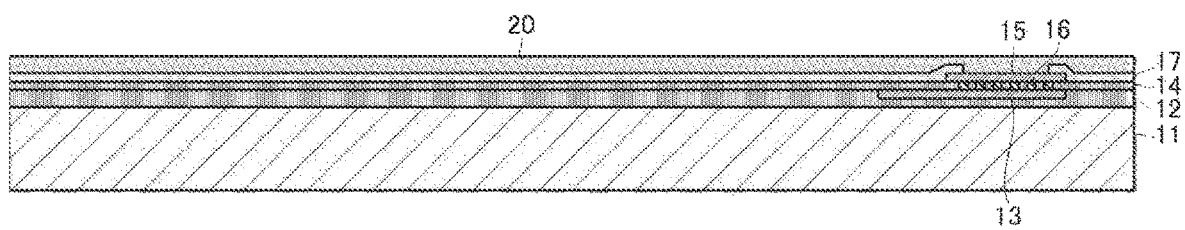

Next, for example, a photosensitive organic insulating member such as polyimide and PBO is applied by spin coating in film thickness of about 8 μm to the surface of the semiconductor substrate 11 which has undergone the wafer processes, whereby forming the lower insulating film 20 that covers the surfaces of the passivation film 17 and the chip electrode 15 (FIG. 2B).

Figure 2C:
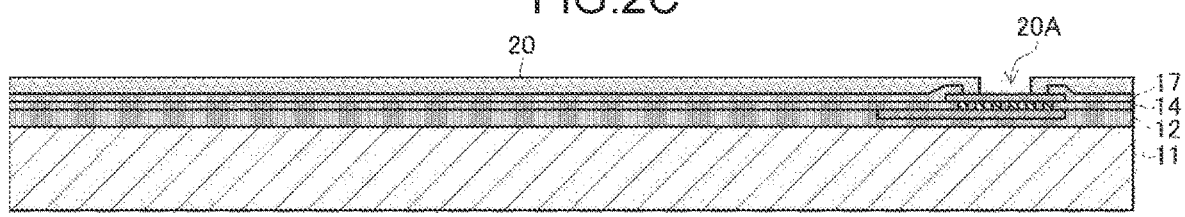

Next, the lower insulating film 20 is exposed to light and developed so that the opening 20A that partially exposes the surface of the chip electrode 15 is formed on the lower insulating film 20 (FIG. 2C).

Figure 2D:
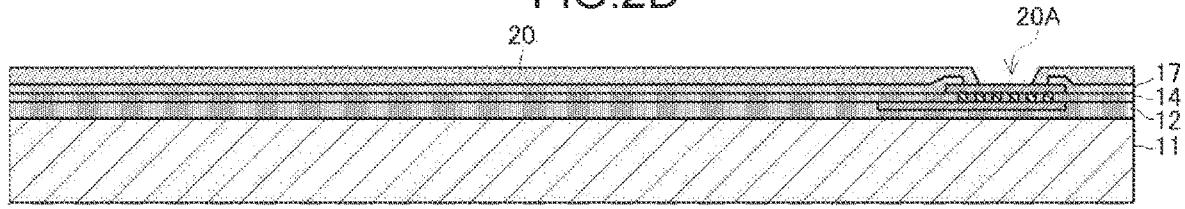

The lower insulating film 20 is then cured by heat treatment. The thermal curing causes the lower insulating film 20 to contract and makes the lower insulating film 20 have a film thickness of about 5 μm, and a side surface of the opening 20A having a substantially vertical shape is formed in a forward tapered shape (FIG. 2D).

Figure 2E:
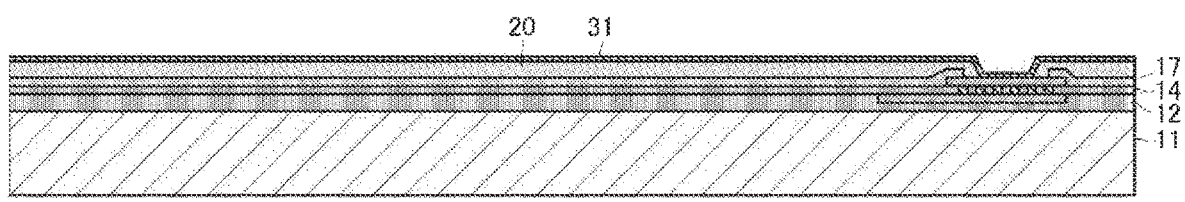
Figure 2F:
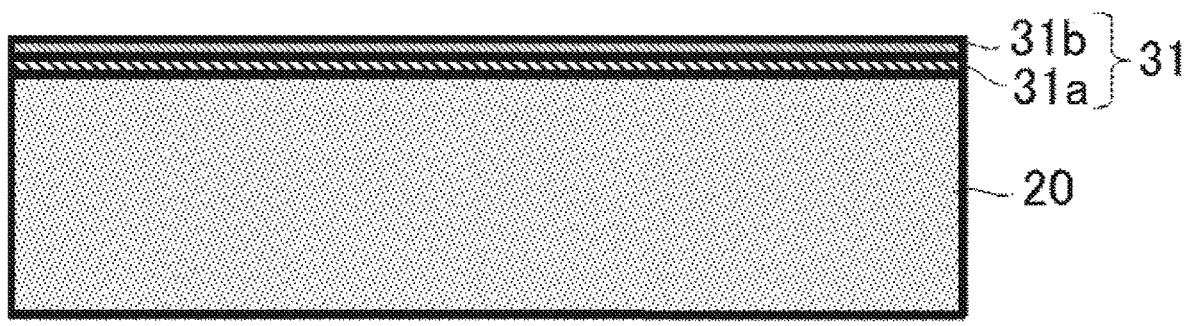

Next, what is formed is the UBM film 31 that covers the surface of the lower insulating film 20 and the surface of the chip electrode 15 that is exposed in the opening 20A of the lower insulating film 20 (FIG. 2E and FIG. 2F). As shown in FIG. 2F, the UBM film 31 is formed by a laminated film including the adhesion layer 31$a$ and the seed layer 31$b$. The adhesion layer 31$a$ enhances the adhesion between the lower insulating film 20 and the redistribution 30, and includes, for example, a Ti film having a thickness of about 150 nm. The seed layer 31$b$ functions as a current-carrying layer when forming the first conductive member 32 and the second conductive member 33 by electroplating, and includes, for example, a Cu film having a thickness of about 300 nm. Each of the adhesion layer 31$a$ and the seed layer 31$b$ is formed by, for example, sputtering.

Figure 2G:
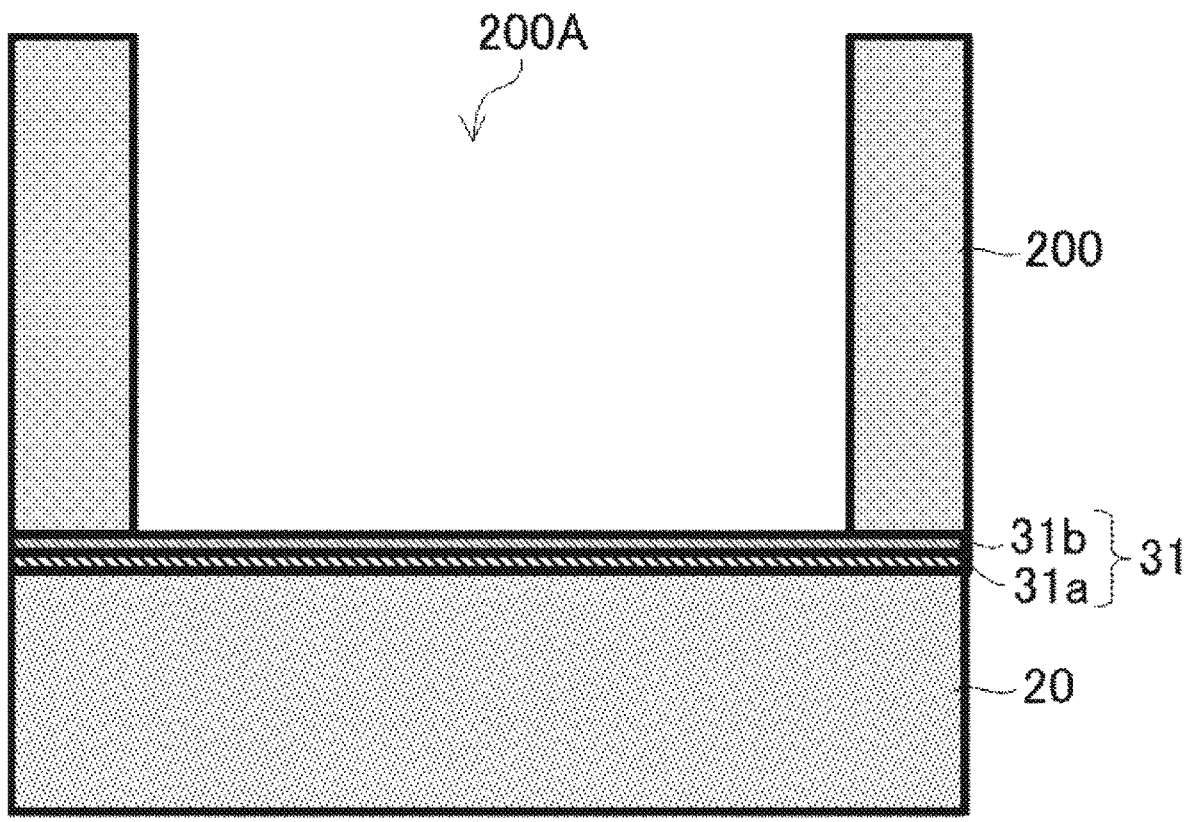

Next, a resist mask 200 including an opening 200A in an area for forming the redistribution 30 is formed on the UBM film 31 (FIG. 2G). The resist mask 200 is formed by applying a resist material including a photosensitive organic insulating member to the UBM film 31 by spin coating and then patterning this resist material by exposure and development.

Next, a Cu film which has a thickness of about 5 μm and serves as the first conductive member 32 is formed by electroplating on the UBM film 31 exposed in the opening 200A of the resist mask 200 (FIG. 2H). In the electroplating, while the surface of the semiconductor substrate 11 is immersed in a plating solution, a current is applied to the seed layer 31$b$ included in the UBM film 31 through a plating electrode (not shown) disposed on the outer periphery of the semiconductor substrate 11. Accordingly, Cu is precipitated on the exposed portion of the UBM film 31, and the first conductive member 32 is formed on the UBM film 31. The seed layer 31$b$ included in the UBM film 31 is incorporated into Cu of the first conductive member 32. Therefore, the Ti film functioning as the adhesion layer 31$a$ is interposed between the first conductive member 32 and the lower insulating film 20.

Figure 2J:
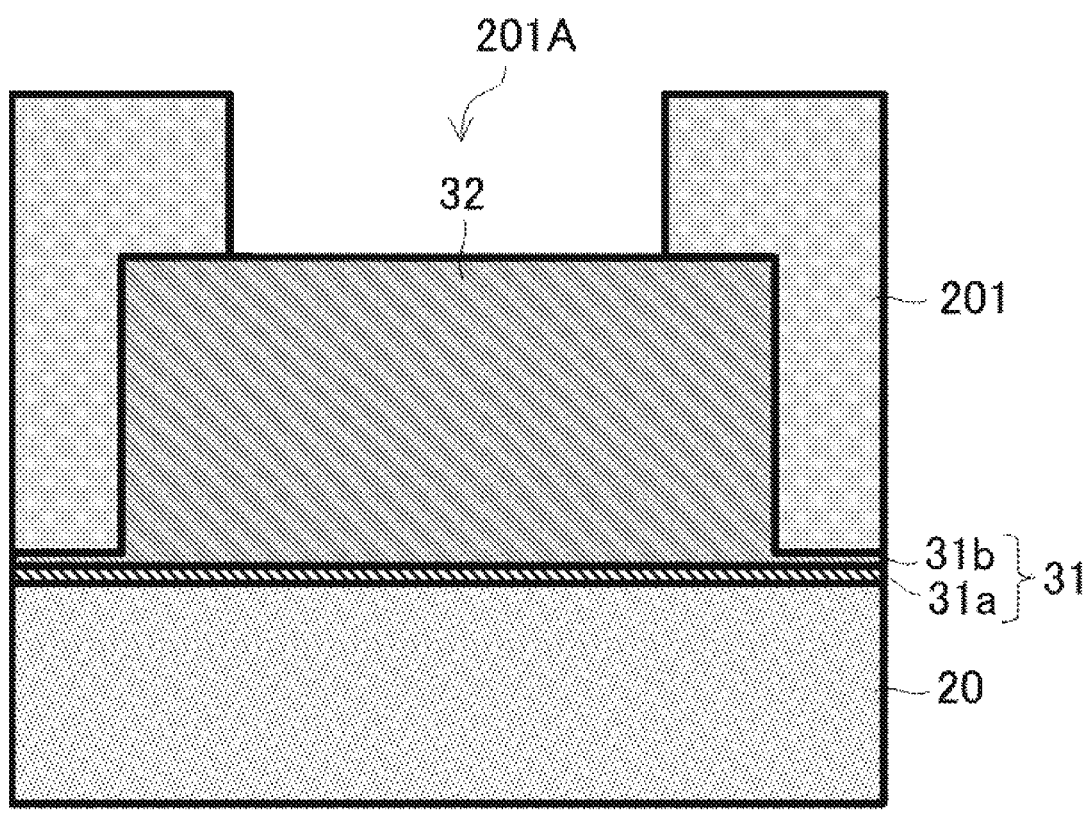

Next, the resist mask 200 is removed by an ashing process or with an organic solvent and the like (FIG. 2I). Next, a resist mask 201 including an opening 201A in an area for forming the second conductive member 33 is formed on the surface of the first conductive member 32 (FIG. 2J). The resist mask 201 is formed by applying a resist material including a photosensitive organic insulating member to the UBM film 31 and the first conductive member 32 by spin coating and then patterning this resist material by exposure and development. An end of the opening 201A of the resist mask 201 is disposed on the inner side with respect to an outer edge of the first conductive member 32, being disposed along the outer edge of the first conductive member 32.

Figure 2K:
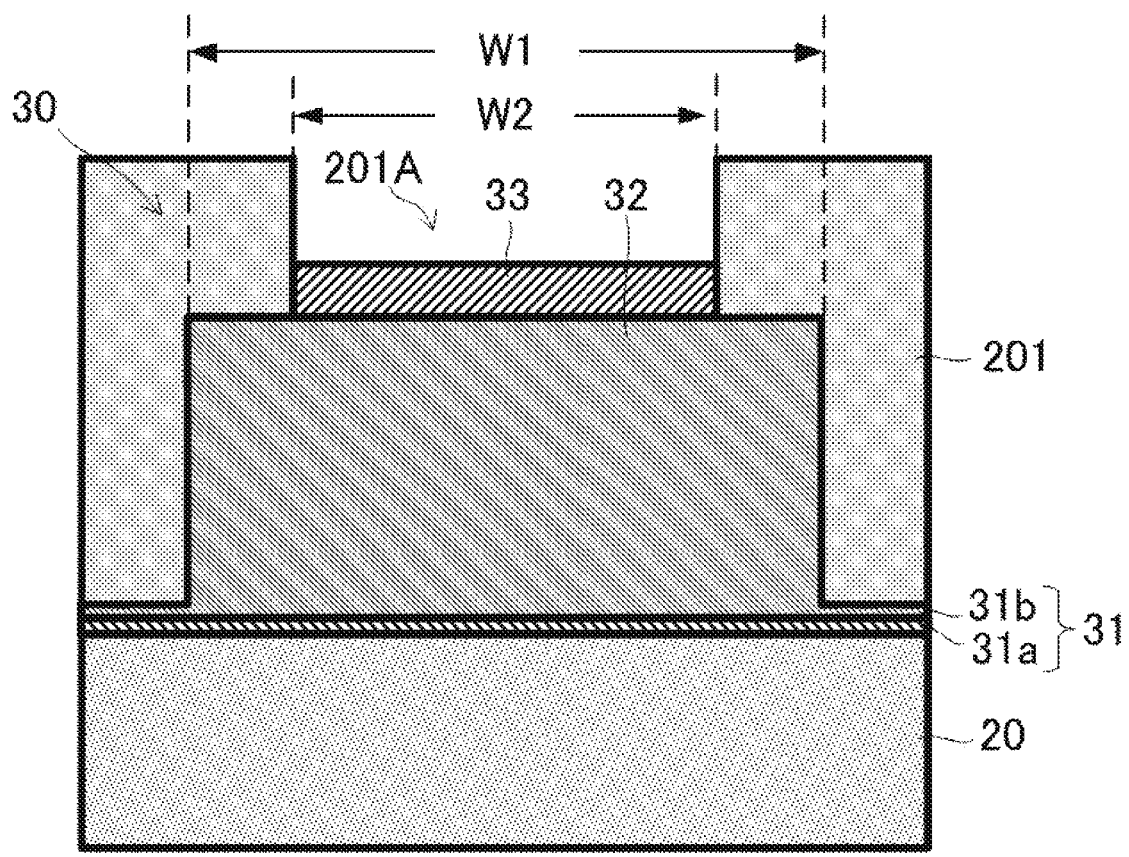

Next, an Au film which has a thickness of about 1 μm and serves as the second conductive member 33 is formed by electroplating on the surface of the first conductive member 32 which is exposed in the opening 201A of the resist mask 201 (FIG. 2K). The second conductive member 33 is formed at the inner side with respect to an end of the first conductive member 32. In this instance of the process, the width W1 of the first conductive member 32 is substantially uniform over the entire area in a thickness direction of the first conductive member 32. The width W2 of the second conductive member 33 is formed smaller than the width W1 of the first conductive member 32. A ratio S2/S1 between a surface area S1 of the second conductive member 33 and a surface area S2 of the exposed portion of the first conductive member 32 (a side surface of the first conductive member 32 and the upper surface that is exposed from the second conductive member 33) is preferably 0.08 or more. In the electroplating, while the surface of the semiconductor substrate 11 is immersed in a plating solution, a current is applied to the seed layer 31b included in the UBM film 31 through a plating electrode (not shown) disposed on the outer periphery of the semiconductor substrate 11. Accordingly, Au is precipitated on the exposed portion of the first conductive member 32, and the second conductive member 33 is formed on the surface of the first conductive member 32. The redistribution 30 is formed by the UBM film 31, the first conductive member 32, and the second conductive member 33.

Figure 2L:
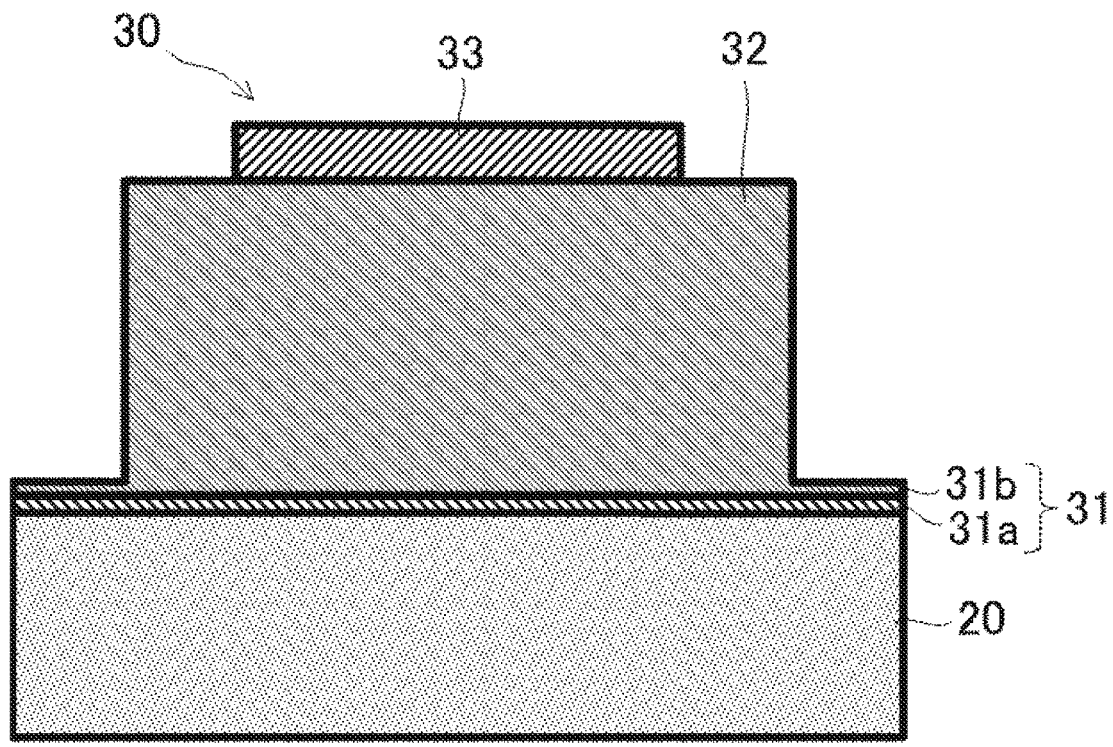

Next, the resist mask 201 is removed by an ashing process or with an organic solvent and the like (FIG. 2L).

Figure 2M:
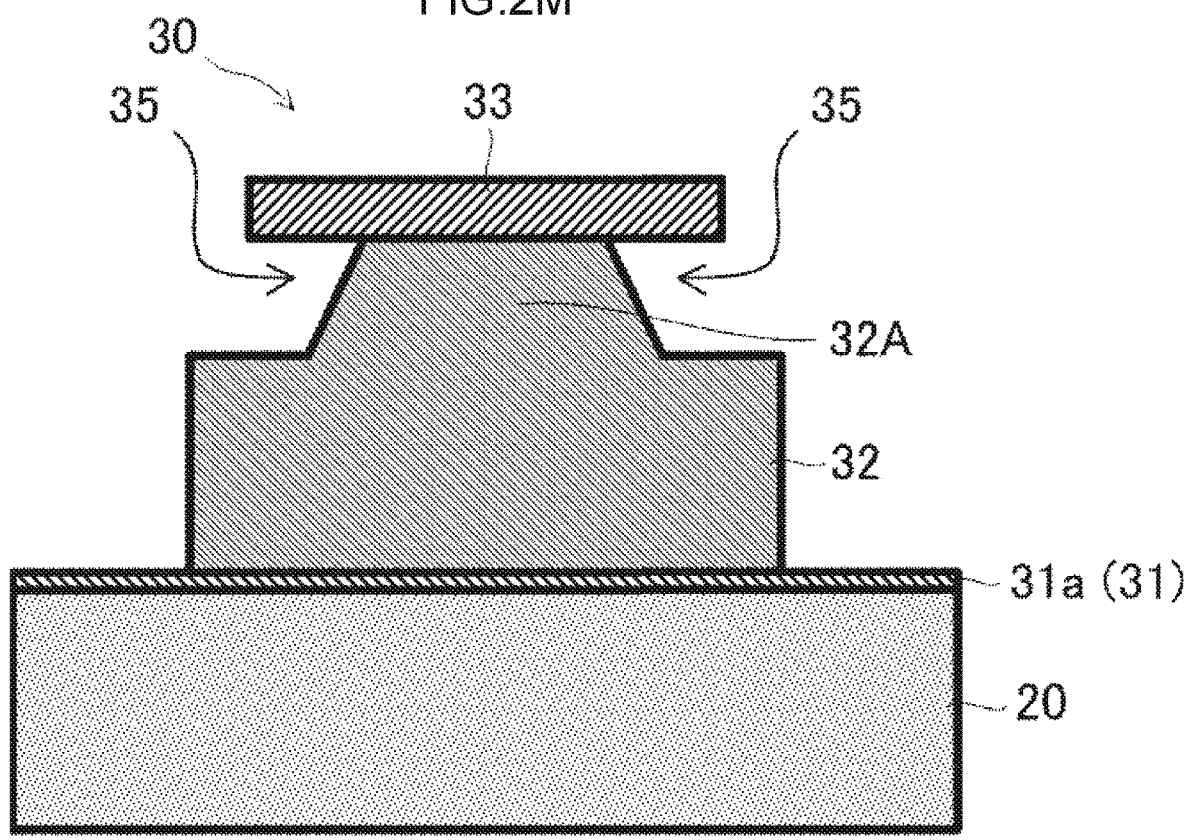

Next, the seed layer 31b is removed by a wet etching process, using a soft etchant or the like (FIG. 2M). The seed layer 31b and a part of the Cu film included in the first conductive member 32 are dissolved by the soft etchant used for removing the seed layer 31b. However, the Au film included in the second conductive member 33 is not dissolved. An etching time is set to a time required for removing the seed layer 31b having a small film thickness. In this etching process, the first conductive member 32 (Cu film) having a large ionization tendency and the second conductive member 33 (Au film) having an ionization tendency smaller than that of the first conductive member 32 are layered, causes a local cell effect. Due to this local cell effect, an etching rate of the first conductive member 32 is higher than an etching rate of the seed layer 31b. Accordingly, in the redistribution 30, the area around the boundary between the first conductive member 32 and the second conductive member 33 is formed with the recess 35 recessed inward in the width direction of the redistribution 30. In other words, the narrowing portion 32A having a width smaller than the lower surface of the first conductive member 32 is formed on the upper surface of the first conductive member 32, and the width of the second conductive member 33 is made smaller than the width of the lower surface of the first conductive member 32 and larger than the width of the upper surface of the first conductive member 32.

Figure 2N:
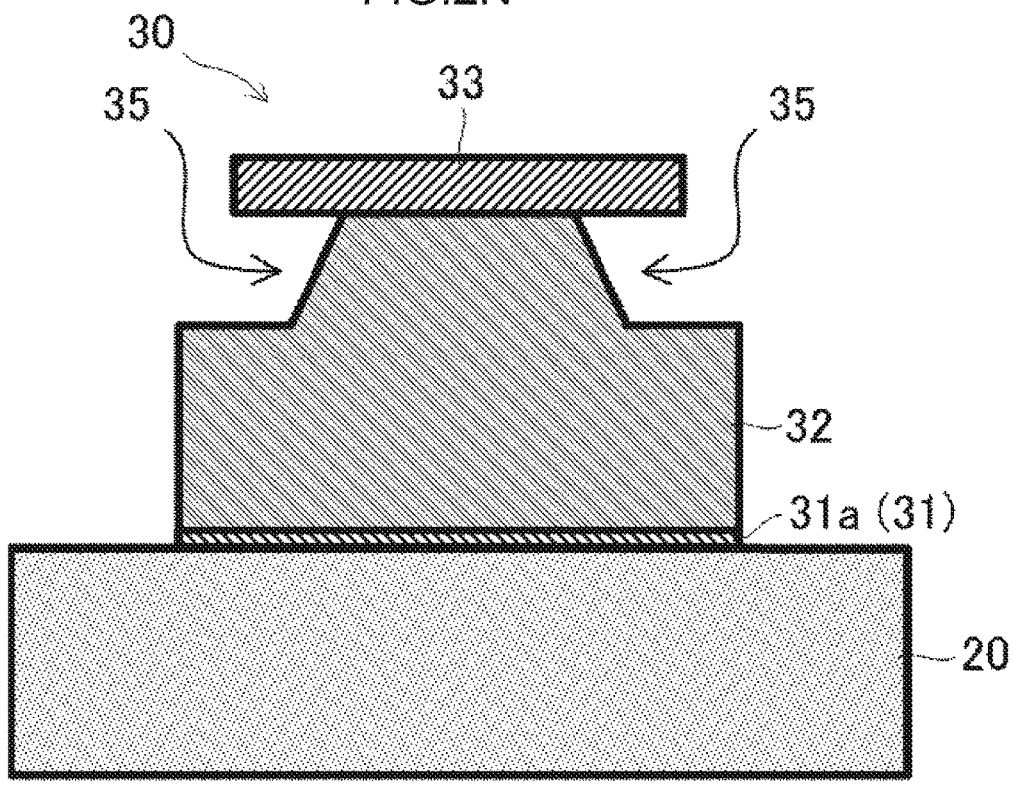
Figure 2O:
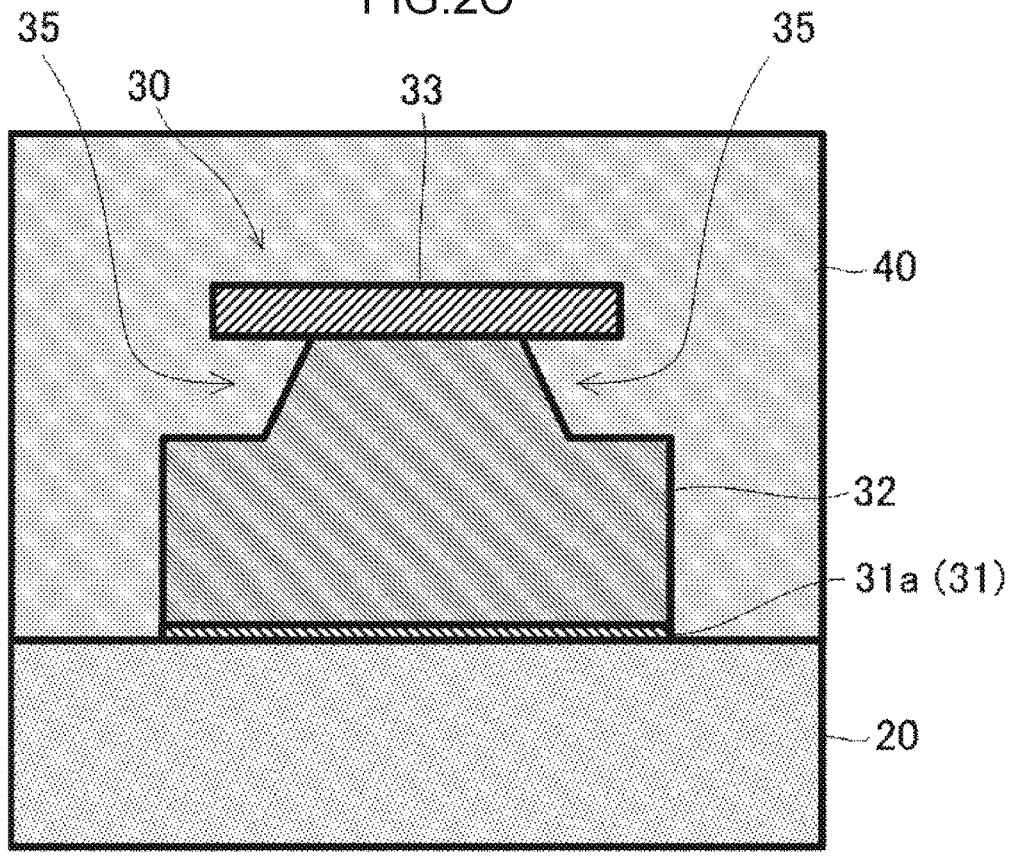
Figure 2P:
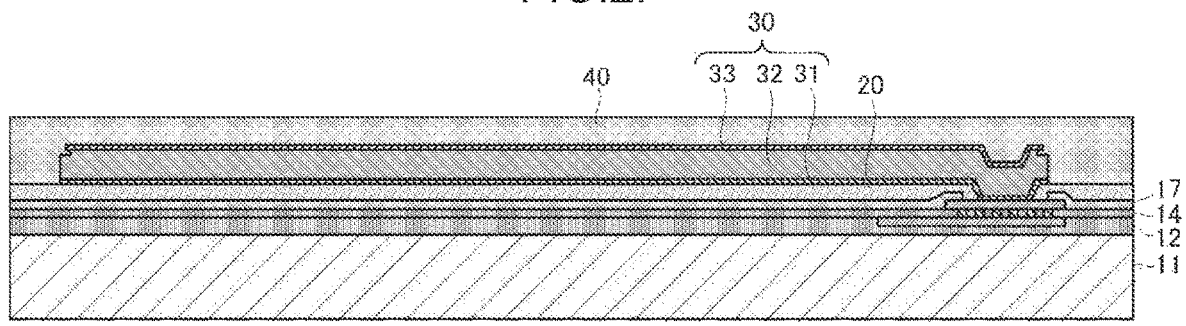

Next, the adhesion layer 31a is removed, using the first conductive member 32 as a mask (FIG. 2N). Next, for example, a photosensitive organic insulating member such as polyimide and PBO is applied by spin coating in film thickness of about 18 μm to the redistribution 30 and the lower insulating film 20, whereby forming the upper insulating film 40 that covers the redistribution 30 and the lower insulating film 20. The upper insulating film 40 fills the recess 35 included in the redistribution 30 (FIG. 2O and FIG. 2P).

Figure 2Q:
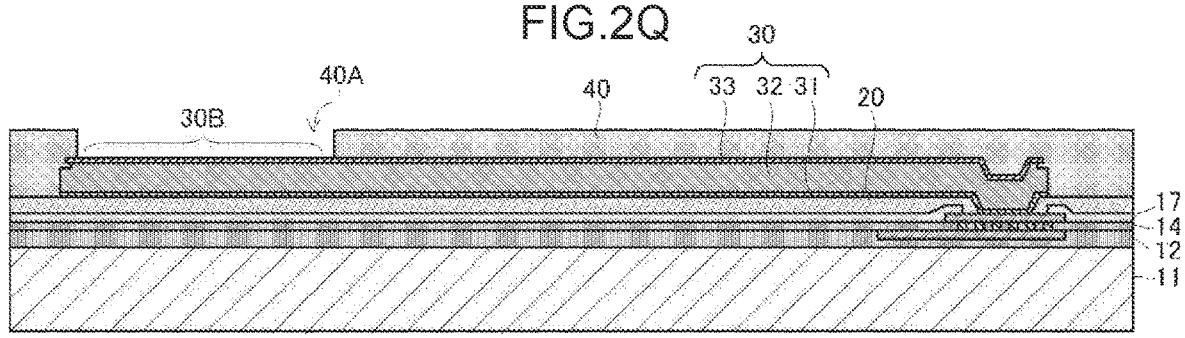

Next, the upper insulating film 40 is exposed to light and developed so that the opening 40A that exposes a surface of the pad portion 30B of the redistribution 30 is formed on the upper insulating film 40 (FIG. 2Q).

Figure 2R:
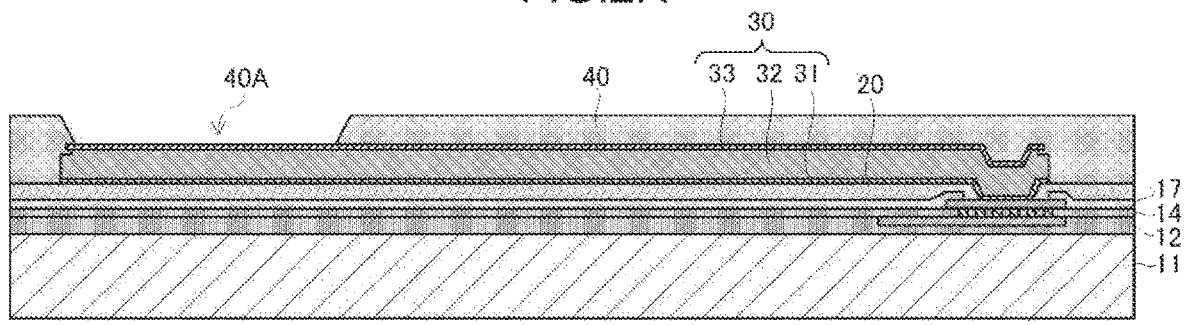
Figure 2S:
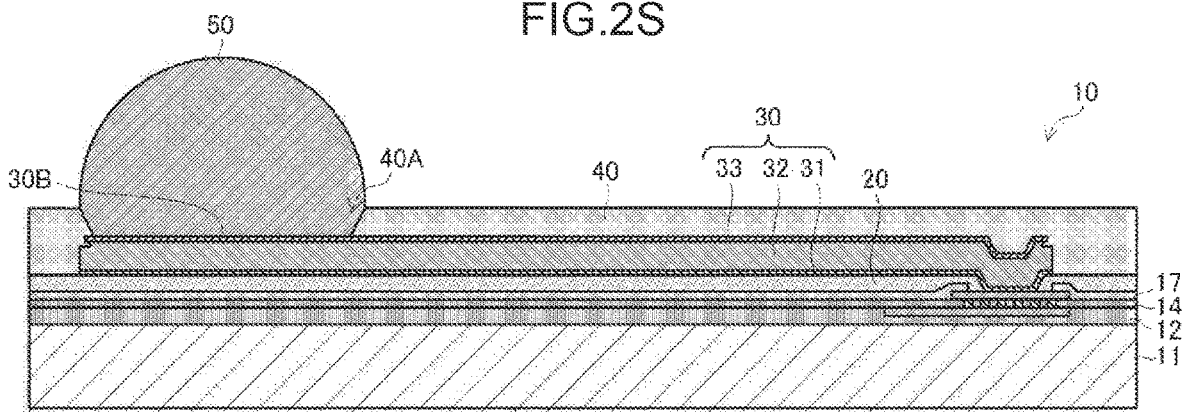

The upper insulating film 40 is then cured by heat treatment. The thermal curing causes the upper insulating film 40 to contract and makes the upper insulating film 40 have a film thickness of about 15 μm, and a side surface of the opening 40A having a substantially vertical shape is formed in a forward tapered shape (FIG. 2R).

Next, the external connection terminal 50 is formed on the surface of the pad portion 30B of the redistribution 30 that is exposed in the opening 40A of the upper insulating film 40 (FIG. 2S). The external connection terminal 50 is formed by reflow after mounting, for example, a SnAg ball on the pad portion 30B of the redistribution 30. The external connection terminal 50 may also be formed by reflow after forming, for example, SnAg paste on the pad portion 30B of the redistribution 30 by screen printing. A protective tape may be attached to the surface of the upper insulating film 40 before the external connection terminal 50 is formed, and the semiconductor substrate 11 may be thinned by grinding the semiconductor substrate 11 from the back of the semiconductor substrate 11.

After the above steps, the semiconductor substrate 11 is divided into plural semiconductor devices, whereby completing the WL-CSP type semiconductor device 10.

FIG. 4A to FIG. 4F are cross-sectional views showing manufacturing processes according to a comparative example. FIG. 4A to FIG. 4K each show a cross-section corresponding to the cross-section taken along line 1C-1C of FIG. 1A.

Figure 4A:
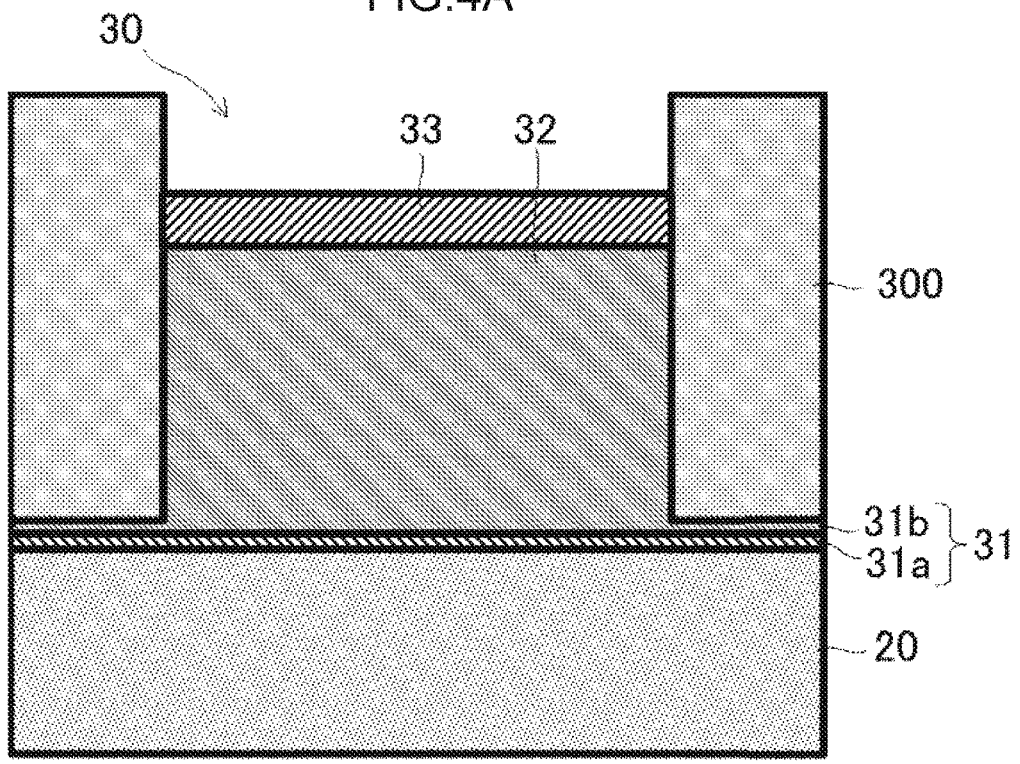
FIG. 4A to FIG. 4F are cross-sectional views showing a manufacturing processes according to a comparative example.

In the manufacturing processes according to the comparative example, the first conductive member 32 (Cu film) and the second conductive member 33 (Au film) included in the redistribution 30 are formed by electroplating, using the identical resist mask 300, and the first conductive member 32 and the second conductive member 33 are formed to have the same width (FIG. 4A).

Figure 4B:
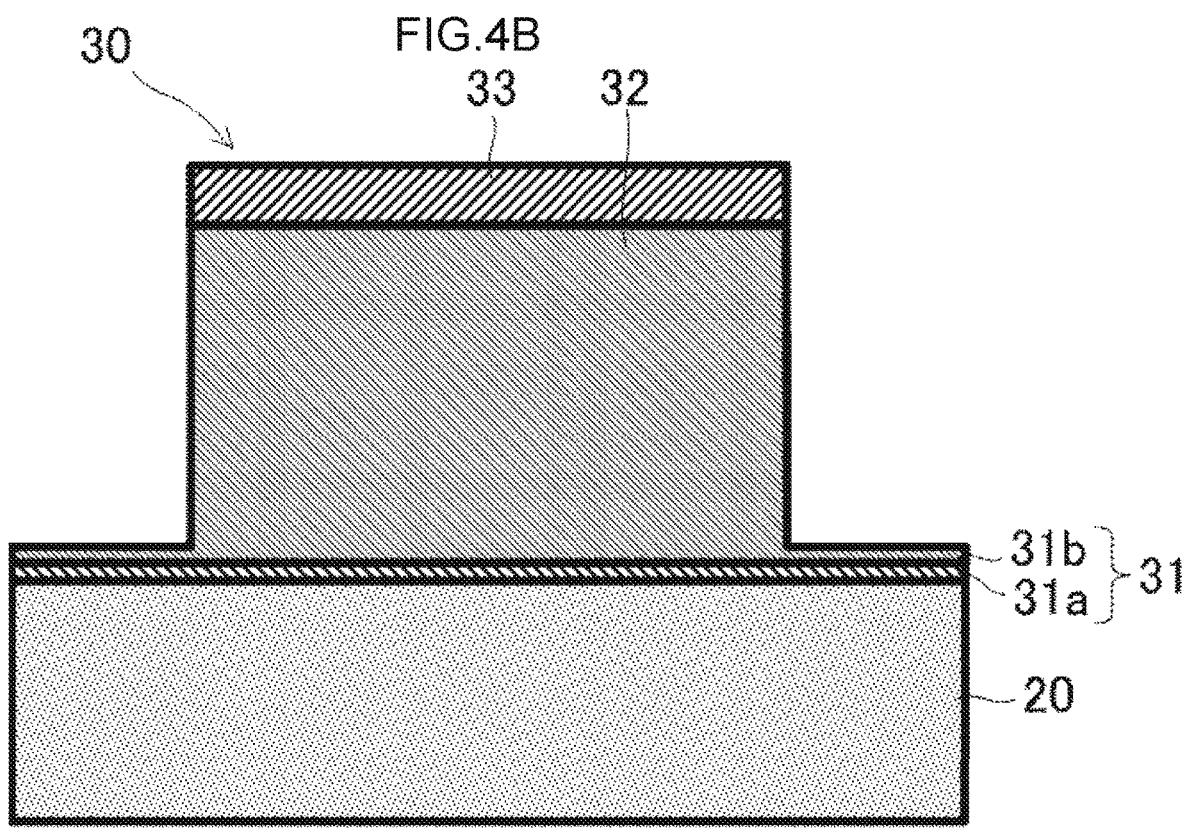

After forming the first conductive member 32 and the second conductive member 33, the resist mask 300 is removed by an ashing process or with an organic solvent and the like (FIG. 4B).

Figure 4C:
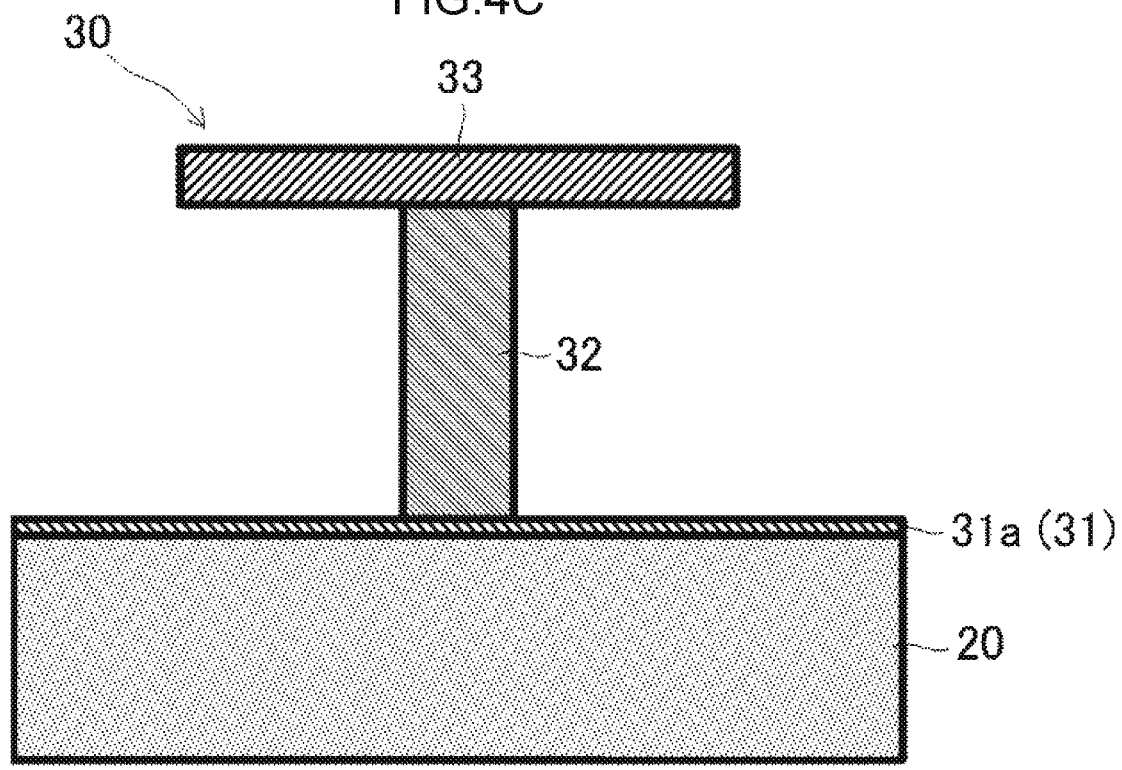

Next, the seed layer 31b is removed by a wet etching process, using a soft etchant or the like. In the etching process of the seed layer 31b, the first conductive member 32 (Cu film) having a large ionization tendency and the second conductive member 33 (Au film) having an ionization tendency smaller than that of the first conductive member 32 are layered, causing a local cell effect. In the manufacturing processes according to the comparative example, the side surface of the first conductive member 32 is excessively etched due to this local cell effect (FIG. 4C).

Figure 5A:
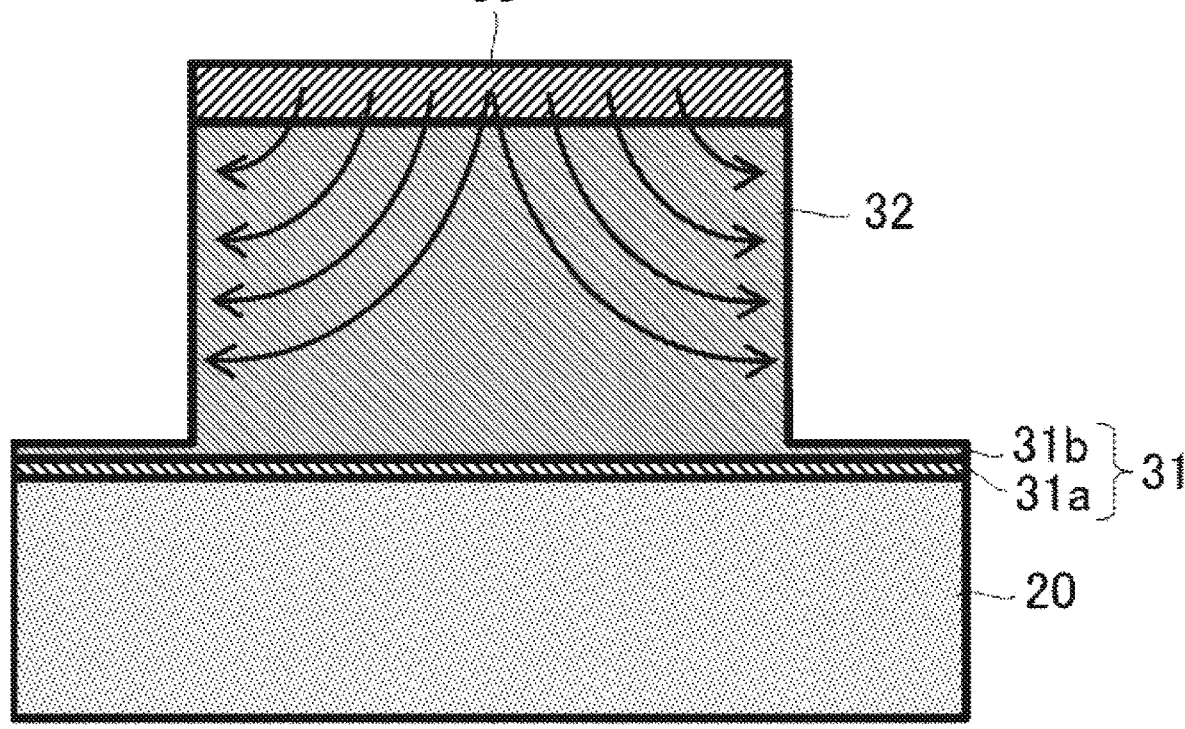
FIG. 5A is a view showing a flow of electrons flowing into a first conductive member, due to a local cell effect, in an etching process of a seed layer according to the comparative example.
Figure 5B:
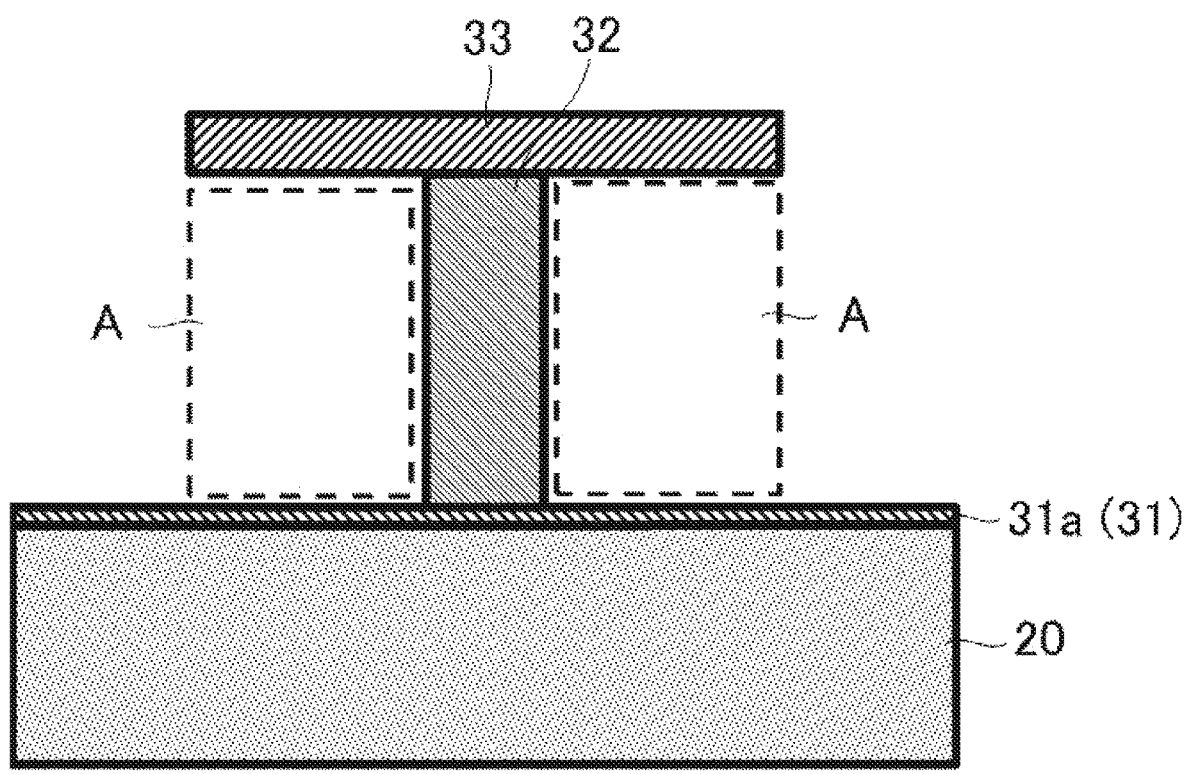
FIG. 5B is a cross-sectional view showing a configuration of a redistribution according to the comparative example.

FIG. 5A is a view showing a flow of electrons flowing into the first conductive member 32, due to the local cell effect, in an etching process of the seed layer 31b according to the comparative example. Due to the local cell effect, Cu included in the first conductive member 32 is ionized and emitted to an etchant. Accordingly, the side surface of the first conductive member 32 is etched over the entire area in the thickness direction. As shown in FIG. 5B, in an area A surrounded by the second conductive member 33 and the first conductive member 32, the etchant forms an environment of a concentrated electrolyte solution, which accelerates ion emission from the first conductive member 32 and promotes etching of the side surface of the first conductive member 32. Accordingly, the side surface of the first conductive member 32 is etched excessively. A local cell effect also occurs, for example, in an Au/Ni/Cu laminated film in which a Ni film or the like is sandwiched between an Au film and a Cu film.

Figure 4D:
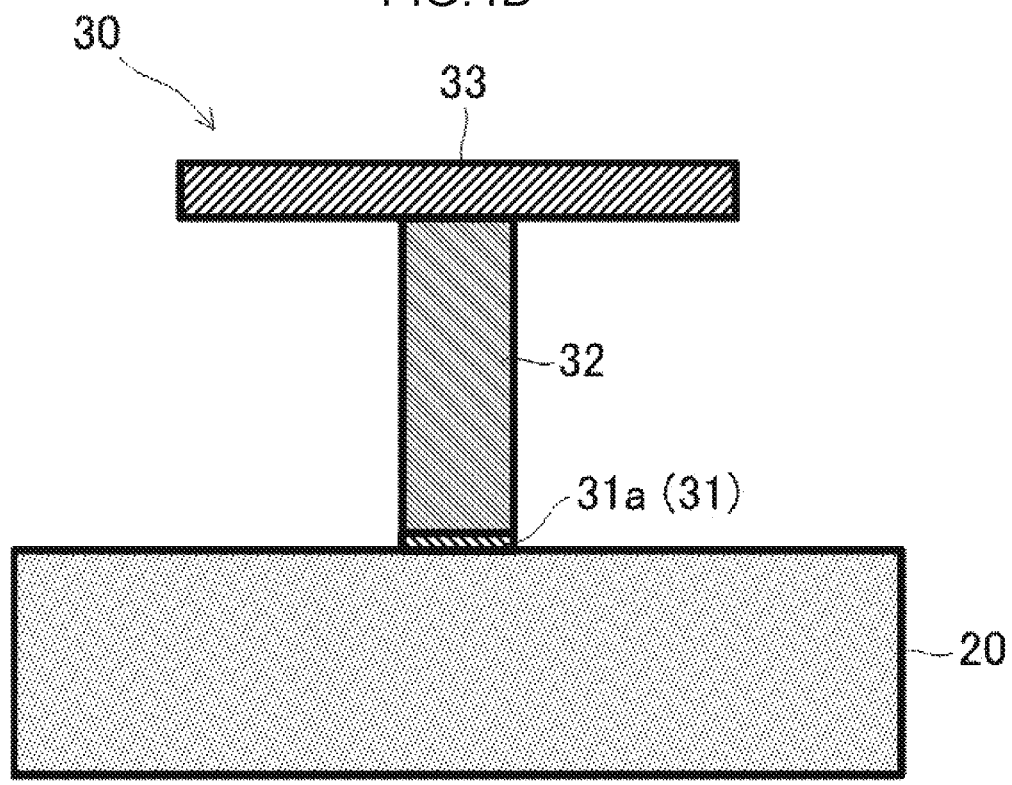
Figure 4E:
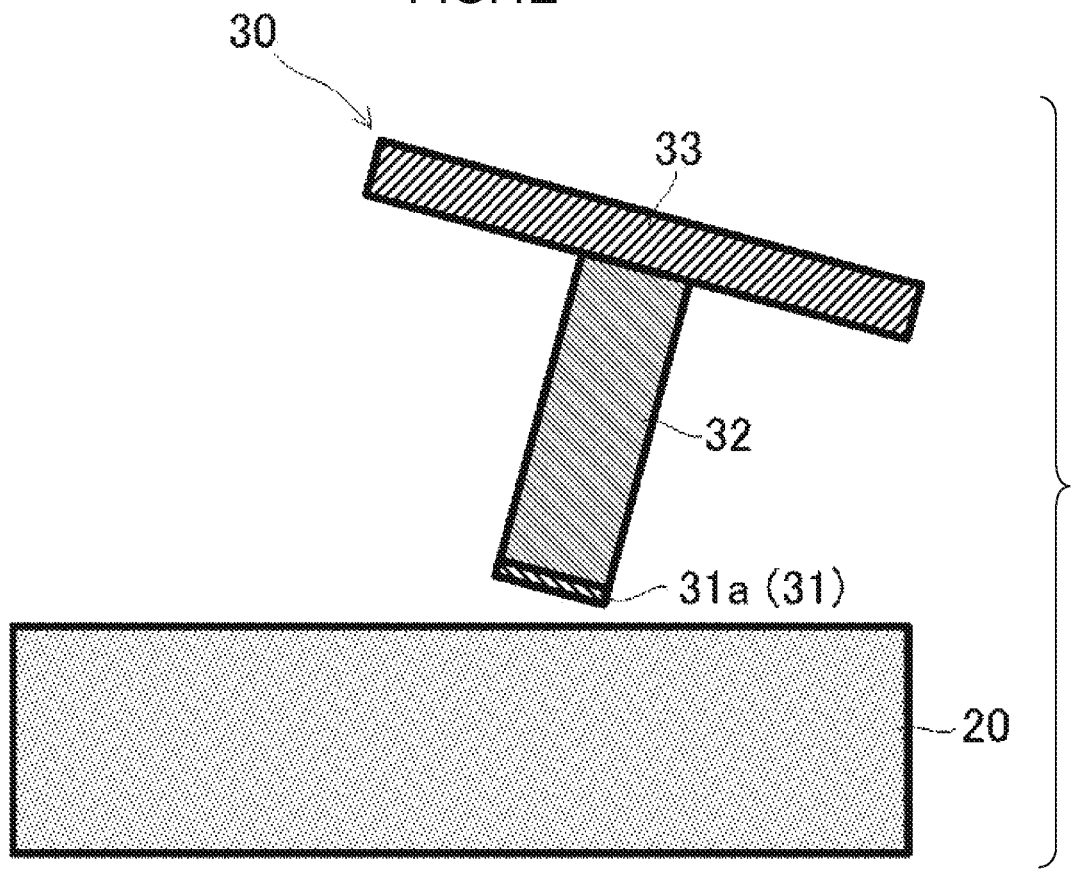

After removing the seed layer 31b, the adhesion layer 31a is removed, using the first conductive member 32 as a mask (FIG. 4D). Along with excessive etching of the first conductive member 32, the adhesion layer 31a that remains under the first conductive member 32 is reduced in width. This results in poor adhesion between the lower insulating film 20 and the redistribution 30, and as shown in FIG. 4E, the redistribution 30 may be peeled from the lower insulating film 20.

Figure 4F:
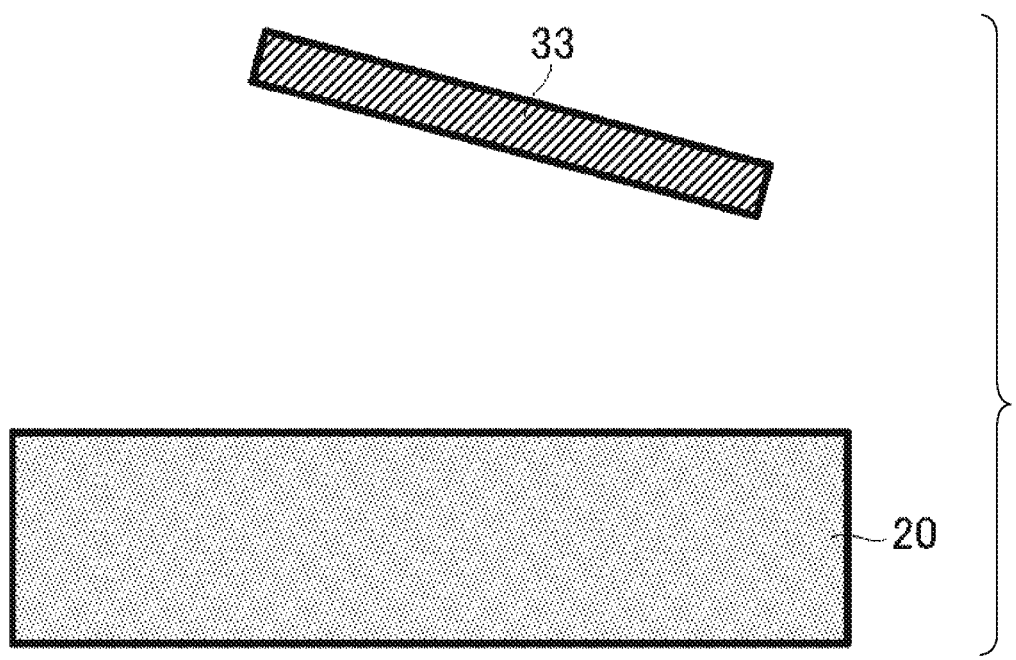

Furthermore, in a case where a wire in the redistribution 30 has a small width, the first conductive member 32 completely vanishes in the etching process of the seed layer 31b, which may cause peeling of the second conductive member 33 as shown in FIG. 4F. In this case, the peeled second conductive member 33 may remain in a manufacturing apparatus and may adhere to other products.

In a semiconductor device manufactured by the manufacturing processes according to the comparative example, as shown in FIG. 4D, the second conductive member 33 covers the excessively etched first conductive member 32 like an eave. Therefore, it is difficult to observe and check the state of the first conductive member 32 from the upper surface. In other words, checking the result of the redistribution 30 may become difficult.

Figure 3A:
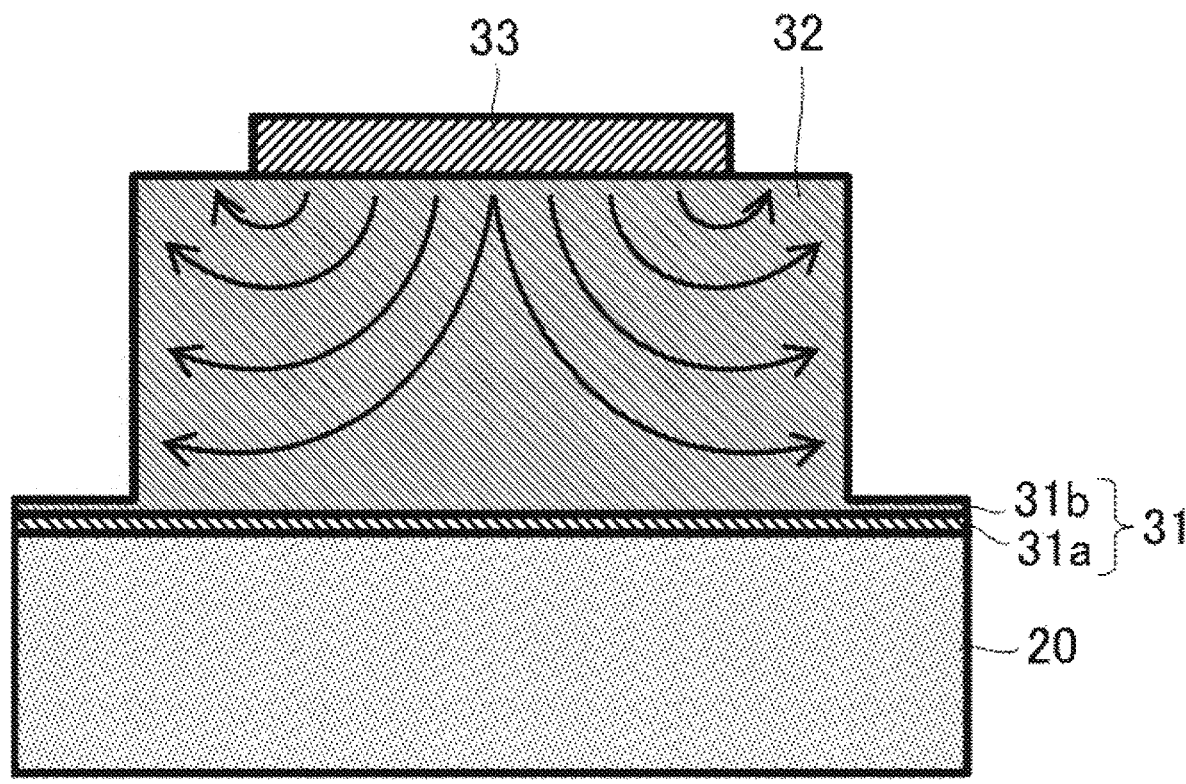
FIG. 3A is a view showing a flow of electrons flowing into a first conductive member, due to a local cell effect, in an etching process of a seed layer according to the exemplary embodiment of the disclosure.

On the other hand, FIG. 3A is a view showing a flow of electrons flowing into the first conductive member 32, due to the local cell effect, in the etching process of the seed layer 31b according to the exemplary embodiment of the disclosure. Due to the local cell effect, Cu included in the first conductive member 32 is ionized and emitted to an etchant. However, in the manufacturing processes according to the exemplary embodiment, the second conductive member 33 is formed to have a width smaller than that of the first conductive member 32. In other words, the ratio of the surface area of the exposed portion of the first conductive member 32 to the surface area of the second conductive member 33 is higher than the ratio in the case of the manufacturing processes according to the comparative example. Accordingly, the concentration of the current flowing into the first conductive member 32 due to the local cell effect is lower than that in the case of the manufacturing processes according to the comparative example. Thus, the exemplary embodiment may prevent of ion emission from the first conductive member 32 and may reduce dissolution rate of the first conductive member 32 (Cu) per unit area.

Figure 3B:
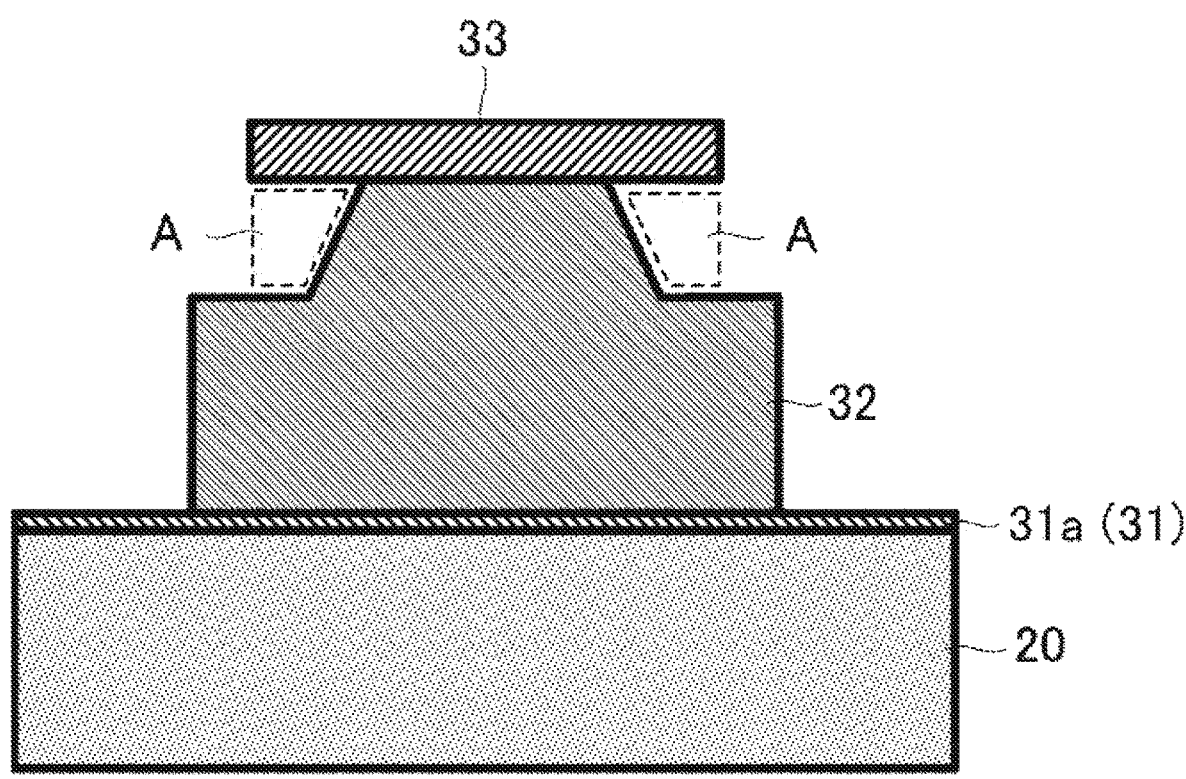
FIG. 3B is a cross-sectional view showing a configuration of the redistribution according to the exemplary embodiment of the disclosure.

In addition, in the exemplary embodiment, as shown in FIG. 3B, the area A surrounded by the first conductive member 32 and the second conductive member 33 is formed gently, compared to the manufacturing processes of the comparative example. Accordingly, the exemplary embodiment may prevent acceleration of the ion emission from the first conductive member 32. Therefore, in the etching process of the seed layer 31b of the exemplary embodiment, the first conductive member 32 may be prevented from being etched excessively. Accordingly, the exemplary embodiment may prevent peeling of the redistribution 30 from the lower insulating film 20 and may prevent vanishing of the first conductive member 32 that causes peeling of the second conductive member 33.

Furthermore, in the semiconductor device 10 according to the exemplary embodiment, as shown in FIG. 1C, the width W2 of the second conductive member 33 is smaller than the width W1b of the lower surface of the first conductive member 32 such that observing and checking the state of the first conductive member 32 from the upper surface is possible. In other words, in the exemplary embodiment checking the result of the redistribution 30 may be possible. This is because the width W1a in the upper surface of the first conductive member 32 is calculated based on a difference between the dimension of a resist opening and the width W1b in the lower surface of the first conductive member 32, and a connection width between the first conductive member 32 and the second conductive member 33 is determined by checking the result of the redistribution 30 from the upper surface.

Herein, the adhesion between the second conductive member 33 including the Au film and the upper insulating film 40 including the organic insulating film is relatively small. Accordingly, peeling of the upper insulating film 40 from the redistribution 30 may occur, and may form a gap between the upper insulating film 40 and the redistribution 30. In a case where moisture fills this gap, the redistribution 30 may corrode and may be defected after long-term use of the semiconductor device 10. Thus, the adhesion between the second conductive member 33 and the upper insulating film 40 affects the long-term reliability of the semiconductor device 10. In the semiconductor device 10 according to the exemplary embodiment of the disclosure, as shown in FIG. 1C, the upper insulating film 40 fills the recess 35 formed in the redistribution 30. Therefore, an anchor effect is generated, and the redistribution 30 may be prevented from peeing off the upper insulating film 40. In other words, the exemplary embodiment may enhance the long-term reliability of the semiconductor device 10.

In addition, in the semiconductor device 10 according to the exemplary embodiment of the disclosure, the redistribution 30 includes the laminated film including the first conductive member 32 that contains the Cu film and the second conductive member 33 that contains the Au film. Therefore, the manufacturing processes of the semiconductor device 10 may not only reduce the resistance in the redistribution 30 but also may prevent oxidation of the first conductive member 32. Furthermore, making the outermost surface of the redistribution 30 with the Au film enables wire bonding with respect to the redistribution 30. Accordingly, depending on the intended use, the exemplary embodiment may create two types of packages, WL-CSP and ordinary package, from an identical chip. In this exemplary embodiment, the second conductive member 33 is illustrated as a member including an Au film. However, the second conductive member 33 may be formed by a laminated film including a Ni film and an Au film. In such case, the Au film may be disposed on the outermost surface of the redistribution 30, and the Ni film may be disposed between the Au film and the first conductive member 32 (Cu film).

What is claimed is:

1. A semiconductor device comprising:
   a wire that extends on a semiconductor substrate, the wire including
      a first conductive member that is disposed on a surface of the semiconductor substrate and that extends parallel to the surface of the semiconductor substrate, and
      a second conductive member that is formed on a surface of the first conductive member and that extends parallel to the first conductive member, the second conductive member having an ionization tendency less than an ionization tendency of the first conductive member;
   a first insulating film disposed between the semiconductor substrate and the wire; and
   a second insulating film that covers the semiconductor substrate, the first insulating film, the first conductive member and the second conductive member,
   wherein the first conductive member includes a first surface disposed close to the second conductive member and having a width smaller than a width of a second surface of the first conductive member which is disposed close to the semiconductor substrate, and
   wherein the second conductive member has a width larger than the width of the first surface of the first conductive member and smaller than the width of the second surface of the first conductive member.

2. The semiconductor device according to claim 1, wherein the wire is connected to an electrode formed in the semiconductor substrate through an opening formed in the first insulating film, and the wire is connected to an external connection terminal through an opening formed in the second insulating film.

3. The semiconductor device according to claim 1, wherein:
   the wire includes a recess recessed inward in a width direction of the wire, the recess being disposed at an area around a boundary between the first conductive member and the second conductive member, and
   the second insulating film fills the recess.

4. The semiconductor device according to claim 1, further comprising a conductive film disposed between the first conductive member and the first insulating film.

5. The semiconductor device according to claim 1, wherein:
   the first conductive member includes a base portion disposed at the second surface and a narrowing portion disposed at the first surface,
   the base portion includes a side wall perpendicular to a principal plane of the semiconductor substrate and an upper surface parallel to the principal plane of the semiconductor substrate, and
   the narrowing portion connected to the upper surface of the base portion includes a bottom portion having a width smaller than a width of the upper surface of the base portion, the narrowing portion having a forward tapered cross-section.

6. The semiconductor device according to claim 1, wherein the first conductive member includes Cu, and the second conductive member includes Au.

* * * * *